United States Patent [19]

Batchelder et al.

[11] Patent Number: 4,647,172
[45] Date of Patent: Mar. 3, 1987

[54] RESIST DEVELOPMENT METHOD

[75] Inventors: William T. Batchelder, Menlo Park; John A. Piatt, Soquel; Kenneth M. Sautter, Sunnyvale, all of Calif.

[73] Assignee: GCA Corporation, Andover, Mass.

[21] Appl. No.: 735,397

[22] Filed: May 17, 1985

[51] Int. Cl.⁴ .................. G03D 5/04; H01L 21/306
[52] U.S. Cl. .................................. 354/298; 156/626; 430/30
[58] Field of Search ............... 354/298; 156/626, 627; 430/30, 311; 118/665; 134/57 R, 113, 151; 356/345, 357, 372, 381, 382; 250/559, 571

[56] References Cited

U.S. PATENT DOCUMENTS

| | | | |
|---|---|---|---|
| 4,136,940 | 1/1979 | Lin | 354/298 |
| 4,462,860 | 7/1984 | Szmanda | 156/626 |
| 4,469,424 | 9/1984 | Matsui et al. | 354/298 |
| 4,493,745 | 1/1985 | Chen et al. | 156/626 |
| 4,501,480 | 2/1985 | Matsui et al. | 354/298 |
| 4,569,717 | 2/1986 | Ohgami et al. | 156/626 |

Primary Examiner—William B. Perkey
Attorney, Agent, or Firm—Pahl, Lorusso & Loud

[57] ABSTRACT

In the resist development method disclosed herein, the spin development of a resist coating on the surface of a semiconductor wafer is monitored by measuring light scattered back from the wafer surface from an incandescent source. During development, the sensed light level oscillates due to optical fringing caused by the thinning of the resist layer in the exposed areas and the fringe generated oscillation essentially stops when the development breaks through in the exposed areas. By comparing sample data obtained from the sensed light level with template data representing a known or characteristic behavior, a control point corresponding to the last fringe may be determined. Development is then terminated a calculated time after the control point.

3 Claims, 1 Drawing Figure

RESIST DEVELOPMENT METHOD

BACKGROUND OF THE INVENTION

The present invention relates to the development of microlithographic resists on the surfaces of semiconductor wafers and more particularly to a variable time method of development.

While it has previously been known to observe or monitor the development of wafer resist in batch processes, e.g., utilizing a laser illuminating a wafer surface through a window in a batch development tank, such procedures have not been available for the spin development of wafers which is the currently preferred method of development in actual production manufacture.

Among the objects of the present invention are the provision of automatic process control for the development of exposed resist on the surface of semiconductor wafers; the provision of such a method which is applicable to spin development of semiconductor wafers; the provision of such a method which provides variable time development; the provision of such a method which prevents over- or under-development; the provision of such a method which optically monitors the progress of the development; the provision of such a method which is highly reliable and which may be implemented by equipment and procedures which are relatively simple and inexpensive. Other objects and features will be in part apparent and in part pointed out hereinafter.

SUMMARY OF THE INVENTION

In accordance of the practice of the present invention, a spot on the surface of a spinning wafer is illuminated from an incandescent light source during development. A photodetector senses light scattered back from the illuminated area and the resultant signal voltage is periodically digitized to obtain sample data. Preferably the sample data is subjected to a smoothing function. The sample data is compared with reference data representing a template which is characteristic of optical fringes generated by a representative development process to determine a control point which characterizes a last fringe in the reference development process. Development is then terminated a calculated time after the control point.

Figure 1:
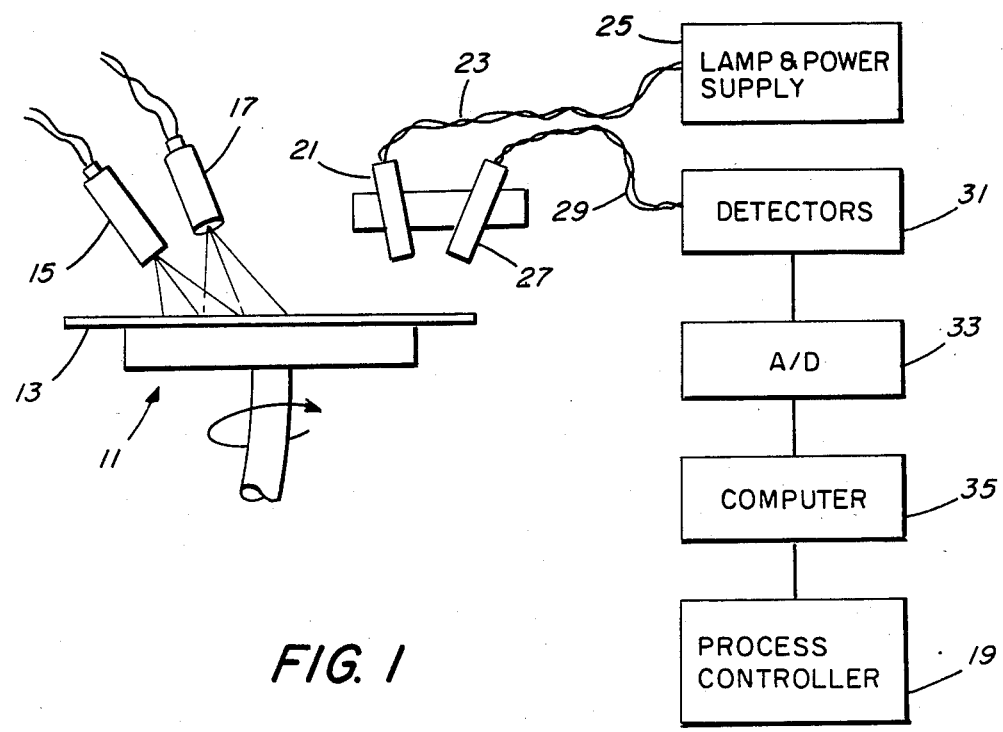
FIG. 1 is a diagramatic illustration of apparatus for performing the development method of the present invention.

Listings 1-5 are computer programs, written in the C language, for controlling the computer in the apparatus of FIG. 1 to perform the development method of the present invention.

DESCRIPTION OF THE PREFERRED EMBODIMENT

Referring now to FIG. 1, a conventional vacuum chuck 11 is shown as holding a semiconductor wafer 13. As is understood by those skilled in the art, the fabrication of semiconductor devices is typically conducted in successive stages, each of which involve the forming of a pattern on the surface of the wafer by microlithographic techniques. For each stage of the process the wafer is typically coated with a resist material and is then exposed in the appropriate pattern. The resist is then developed and the process step, e.g. etching, is then performed to locally impart the appropriate physical changes in the semiconductor material to yield the desired device structure. Increasingly, semiconductor wafers are being processed on automatic or in-line continuous systems, rather than in batch processes. The present invention is particularly adapted for use on the automated fabrication equipment sold by the GCA Corporation of Bedford, Mass., under the trademark Wafertrack.

In such automated or in-line equipment, the chuck 11 holding the wafer 13 is spun during the development process and the upper surface of the wafer may be sprayed with either rinse water or a developer solution. In FIG. 1, appropriate nozzles 15 and 17 are shown for spraying rinse water and developer respectively, the operation of these spray devices as well as the operation of the chuck 11 being under the control of a conventional process controller or sequencer, such a controller being indicated generally by reference character 19.

In accordance with the usual or conventional philosophy of resist development, the exposure of the resist is employed as the process variable which is subject to adjustment to provide the desired results and great efforts are made to rigidly control all other development parameters. In accordance with the philosophy of the present invention, however, it has been recognized that there are simply too many variables to hold constant for a long enough time to allow effective process monitoring based on completed wafers. Therefore, in sharp contrast with conventional thinking, the present invention proceeds on the philosophy of empirical development by recognizing a behavior which is characteristic of the development process itself and by utilizing that behavior to effect automatic process control through variable development time.

In accordance with the practice of the present invention, a spot or local area on the surface of the rotating wafer is illuminated with light generated from an incandescent source. An appropriate source has been found to be a conventional microscope illuminator fitted with a uv blocking filter to provide light which is non-exposing to the wafer resist. In FIG. 1, projection optics for directing light onto the surface of the wafer are indicated by reference character 21. The projection optics 21 are connected by a fiber-optic bundle 23 to an integrated lamp and lamp power supply unit 25. Pickup optics, which are essentially similar to the projection optics 21, are provided as indicated by reference character 27. These pickup optics gather light scattered back from the surface of the wafer and the gathered light is conducted by a fiber-optic bundle 29 back to a detector assembly 31. Preferably, the fiberoptic bundle 29 divides into multiple paths at the detector assembly 31 so that multiple detector can be used, each with a characteristic narrow band filter. As is described in greater detail hereinafter, different substrates and different developer solutions may make it appropriate to use different wavelength bands and thus the provision of multiple detectors allows the selection of the wavelength band to be made electronically rather than by mechanical substitution. As is explained in greater detail hereinafter, the algorithm which controls process termination in accordance with the present invention is sufficiently sensitive and accurate that filtered incandescent light may be used, i.e. light having a significant band-width, rather than the purely monochromatic light of a laser.

The electrical voltage signals provided by the detectors are periodically digitized by a multiplexed analog-to-digital converter, indicated generally by reference character 33, to generate a corresponding digital data stream. This data is sampled and stored by a digital computer 35 for subsequent processing and utilization as described hereinafter. In accordance with the invention as presently practiced, the computer 35 is an IBM PC and the control program of FIG. 3 is written in the "C" language which is compiled and run on that machine using a "C" compiler from Lifeboat Associates.

In the typical development of the resist on the surface of a semiconductor wafer, the first step is to spray the wafer with rinse water to wet its surface. Then the developer spray is turned on to initiate the actual development process itself. As the development process proceeds, the exposed resist is thinned so that interference type optical fringes will typically occur and will cause oscillations in the level of light scattered back from the surface of the wafer. Further, as the developer breaks through to the surface of the substrate in the exposed areas, the optical oscillations will typically die out.

In accordance with the practice of the present invention, briefly stated, the data stream representing the light scattered back from the wafer under development is compared with reference data representing a template characteristic of the optical fringes generated by a representative development process to determine a control point which characterizes a last fringe in the development process. The development process is then terminated a calculated time after the control point. As will be understood from even this brief description, the method of the present invention provides a variable time of development in contrast with the usual process philosophy of rigidly fixed development parameters, including a fixed time of development.

Before going into the particular computer programs which perform the method of the present invention, it is appropriate to first describe in general terms the processes which are implemented thereby. As indicated previously, the automatic process control of the present invention involves comparison of sample data with reference data representing a template. While useful templates can be constructed or generated by various methods including mathematical simulation and graphical plotting aided by human intuition, it is presently preferred that each template for a given semiconductor development process be generated from actual data obtained in the same manner as the sample data which is used during actual production. In other words, a representative wafer is run through the development process using carefully controlled standard conditions and the monitoring system is allowed to acquire data in the same manner as during a production run but the development process is terminated at a predetermined time rather than under the control of the automatic process controller of the present invention. Whether the data being gathered is going to be used for automatic process control or for the generation of a template, it is initially stored in the memory of the computer.

In order to better perceive the desired oscillatory signal which is characteristic of the optical fringing, the data is initially smoothed to remove artifacts or transients which obscure the desired information. A form of running weighted average is employed for this purpose. If the smooth data is going to be used in the construction of a template, it is typically stored on a disk file for later analysis and determination of an appropriate control point based on the operator's knowledge of the process parameters. Data generated during product production runs may also be stored on disk files if it is desired to build a history for later evaluation or study.

Conversion of the stored data into a template involves merely choosing, from an overall data run, a subregion which best characterizes the behavior of interest, i.e. the fringing oscillations and the cessation of those oscillations as breakthrough occurs and the choosing of a time, i.e. the control point, within that region which is representative of the last fringe oscillation. The data representing the selected subregion together with the representative control point is then stored in a file as a template against which sample data can be compared during production.

In actual production, the operator must choose a time at which data analysis is to begin. This time must be chosen to provide reasonable time for computation prior to the earliest expected time at which development would be terminated. As noted previously, termination of development is effected at a point which is a calculated interval after the "control point". As described in greater detail hereinafter the system provides for a predictable scaling factor, designated the "A" value which is used for calculating the time for terminating development from the control point time. In typical commercial development processes, it has been found that the optimum time from control point to termination of development is nearly equal to the time from the initiation of development to the control point. For example, a representative development time might be 40 seconds with the control point occurring at about 20 seconds ("A" value equal to 2). However, as it is the whole thrust of the present invention to permit adjustment of the development time to accommodate for variations in drift in other process parameters, some range in development times must be accommodated. For the purpose of example, a range of from 30 to 50 seconds may be assumed, with control points correspondingly ranging from 15 to 25 seconds. In order to allow for detection of control points occurring as late as 25 seconds, analysis of sample data is delayed until this time. On the other hand, data analysis must be completed in time to be finished by the time of the earliest possible development completion time, i.e. 30 seconds. This range of five seconds, however, is sufficient to allow the particular computer used, i.e. the IBM PC, to perform the algorithms implemented by the programs described hereinafter.

During an actual production run, data is collected during the development process up to the cutoff time selected by the operator, e.g. 25 seconds. At this point, the data file created during the data acquisition is compared with the template. The particular algorithm chosen for finding a best fit between the sample data and the template is a method which tries to fit the template to the data at successive positions in time and, for each position, generates a score based on the degree of fit, the particular scoring system employed being a so-called chi-squared valuation. The successive scores generated are stored in a separate array and then this array is scanned for a minimum value to determine at which time-shifted position the best fit occurs between the sample data and the template. In order to speed the calculation process while providing a high degree of resolution, the particular implementation employed uses several degrees of resolution. Starting with a relatively coarse resolution, the program first locates a crude best fit and then increases the level of resolution to refine the fit and determine the control point with the highest degree of accuracy. When the time of the control point is located, this value is then scaled, e.g. doubled in accordance with the assumption made initially, to determine a time in which development should be terminated. Assuming that the automatic process control is active, the computer then signals the machine controller 19 to terminate the development at the thus calculated point in time.

As indicated previously, the implementation of this automatic process control has, in the described embodiment, been implemented in a general purpose computer, i.e., an IBM PC. The program which implements the control function of the present invention is included within an overall operator interactive control program which allows, not only for the choosing of the particular control algorithm and variables which may depend upon the particular development process, but also allows for the real time display of the data being accumulated and for the analysis of the data obtained in relation to externally obtained information, e.g. observed line widths. These other functions form no part of the present invention and are not described in detail herein though calls to these functions may be noted in the overall menu program.

The overall menu program is given in Listing 1, the program name being apcmenus.c. As will be apparent to those skilled in the programming art, this supervisory or top level program allows the operator to select various functions to be performed and, depending upon the choice, print the data or make selections to enable the chosen function. The top level choices are to calibrate wafers, to run wafers, to examine APC data files, to run diagnostics, and to run trend charts. The last two functions, as noted previously, form no part of the present invention and are thus not discussed further. If the operator chooses to run wafers, whether for the generation of template data or for a production run of product wafers, this top level program calls the program set forth in Listing 2, this program being named apcdevel.c. As will be appreciated, the details of this program are peculiar to the particular piece of development equipment being utilized, e.g. the development station incorporated in the Wafertrack system made and sold by the GCA Corporation. The parameters passed to the development control program from the supervisory or top level program APC Menus the development program whether or not the automatic processor controller of the present invention is to terminate the development process or not an, if not, the fixed time for development. In the interaction between the computer and the operator, the operator is given an opportunity to enter a file name under which data acquired by the monitoring system is to be stored.

The program set forth in Listing 3, designated apc-files.c allows data acquired by the monitoring system to be graphically displayed on the computer screen and allows the operator to interactively create a template from this data. In particular, the operator is allowed to position a cursor on the graphically displayed data and designate the point selected by the cursor as the control point. As will be understood, this allows a certain degree of operator intuition to be incorporated into the determination of the last fringe oscillation based upon the operator's experience and knowledge of process behavior.

As indicated previously, development is terminated a predetermined time interval after the control point once the control point has been located by comparing sample data with the template. The program set forth in Listing 4, designated apc-cal2.c allows the user to enter this value, designated the "A" value either arbitrarily or from empirically obtained information on process behavior, e.g. line widths obtained by microscopic observation following development. Again, this is an interactive program employing the graphs capabilities of the IBM PC and allows the operator to plot resultant line widths vs. development times and from that plot determine the best "A" value.

Once an "A" value and a suitable template for a given development process have been obtained, a production run under control of the automatic process controller of the present invention may be initiated. As indicated previously, the running of a wafer is controlled by the program apcdevel.c of Listing2. However, if this program is informed that the automatic process controller of the present invention is active, this program will initiate analysis of the sample data once the latest possible time for the expected control point has passed and well before the expected earliest completion of development in accordance with the philosophy described previously. Using the values hypothesized earlier (A=2) this might be 25 seconds after the start of development.

The actual comparison of sample data with the selected template is performed by the program ENDPNT shown in Listing 5. As indicated previously, the ENDPNT program normalizes the sample data and makes a shifting comparison of that data with the template data to obtain a least squares fit of the template to the data. From this best fit, this program returns a value representing the control point time to the program apcdevel.c which, using that time and the "A" value determines an end of development time and appropriately signals the development apparatus to cut off development at that time.

By using the variable development time method of the present invention, it is possible to obtain a substantial reduction in the effects which would otherwise be caused by variations in other process parameters. For example, variations in exposure time of from 180 to 250 milliseconds would cause a variation in line width of from 2.35 microns to 2.75 microns with a constant development time of 30 seconds. However, using the method of the present invention, variable development times of from 22 to 40 seconds held line widths within ±0.05 microns of the nominal value of 2.60 microns. Similar improvements can be observed with respect to variations in resist coating thickness and resist baking times.

In view of the foregoing, it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

What is claimed is:

1. Apparatus for developing exposed resist on the surface of a semiconductor wafer during fabrication of integrated circuits which comprises:

means for spinning the wafer;

means for spraying developer on the wafer surface to cause development of the resist;

means illuminating at least a spot on the wafer surface from an incandescent light source;

a photodetector, for sensing light scattered back from the illuminated spot on the wafer surface and generating therefrom a signal voltage;

means for periodically digiting said voltage to generate sample data;

means for storing reference data representing a template characteristic of a representative development process, said reference data including a reference control point which characterizes a known point in the reference development process;

means for comparing the sample data and the reference data to obtain a best fit and to thereby locate a control point in the sample data which corresponds to the reference control point; and means for terminating development a calculated time interval after said sample control point.

2. Apparatus for developing exposed resist on the surface of a semiconductor wafer during fabrication of integrated circuits which comprises:

means for spinning the wafer;

means for spraying developer on the wafer surface to cause development of the resist;

means illuminating at least a spot on the wafer surface;

a photodetector, for sensing light scattered back from the illuminated spot on the wafer surface and generating therefrom a signal voltage;

means for periodically digiting said voltage to generate sample data;

means for storing reference data representing a template characteristic of optical fringes generated by a representative development process, said reference data including a reference control point which characterizes a last fringe in the reference development process;

means for comparing the sample data and the reference data to obtain a best fit and to thereby locate a control point in the sample data which corresponds to the reference control point; and means for terminating development a calculated time interval after said sample control point.

3. Apparatus for developing exposed resist on the surface of a semiconductor wafer during fabrication of integrated circuits which comprises:

means for spinning the wafer;

means for spraying developer on the wafer surface to cause development of the resist;

means illuminating at least a spot on the wafer surface during development from an incandescent light source filtered to provide only non-exposing wavelengths;

a photodetector, for sensing light scattered back from the illuminated spot on the wafer surface and generating therefrom a signal voltage;

means for periodically digiting said voltage to generate sample data;

means for storing reference data representing a template characteristic of optical fringes generated by a representative development process, said reference data including a reference control point which means for analyzing the sample data to locate a control point in the sample data which characterizes a last fringe in the reference development process; and means for terminating development a calculated time interval after said control point.

* * * * *